United States Patent [19]

Riddle et al.

[11] 4,439,804

[45] Mar. 27, 1984

[54] PROTECTION CIRCUIT FOR MEMORY PROGRAMMING SYSTEM

[75] Inventors: Michael H. Riddle, Cherry Hill; John R. Orr, Pennsauken, both of N.J.

[73] Assignee: RCA Corporation, New York, N.Y.

[21] Appl. No.: 360,810

[22] Filed: Mar. 22, 1982

[51] Int. Cl.³ .............................................. H02H 7/09
[52] U.S. Cl. ...................................... 361/92; 365/189
[58] Field of Search .................. 361/92; 365/189, 195, 365/196; 307/200 A

[56] References Cited

U.S. PATENT DOCUMENTS

| | | | |
|---|---|---|---|
| 3,757,302 | 9/1973 | Pollitt | 361/92 X |
| 3,818,366 | 6/1974 | Arimura et al. | 330/207 P |
| 4,099,068 | 7/1978 | Kobayashi et al. | 361/92 X |
| 4,337,524 | 6/1982 | Parkinson | 365/189 X |
| 4,366,560 | 12/1982 | McDermott et al. | 361/92 X |

OTHER PUBLICATIONS

Intel Corp., 2816 16k (2K ×8) Electrically Erasable PROM data sheet, Apr., 1981.

*Primary Examiner*—Harry E. Moose, Jr.
*Attorney, Agent, or Firm*—Joseph S. Tripoli; Robert L. Troike; Christopher L. Maginniss

[57] ABSTRACT

A protection circuit inhibits the generation of a write-erase signal to an E²PROM when the logic supply voltage falls below a predetermined threshold level. A differential-input amplifier compares the logic supply voltage with a fixed potential and when the logic voltage drops below the threshold, a transistor coupled to the write-erase signal generator switches to its conductive state inhibiting further occurrences of the signal.

7 Claims, 1 Drawing Figure

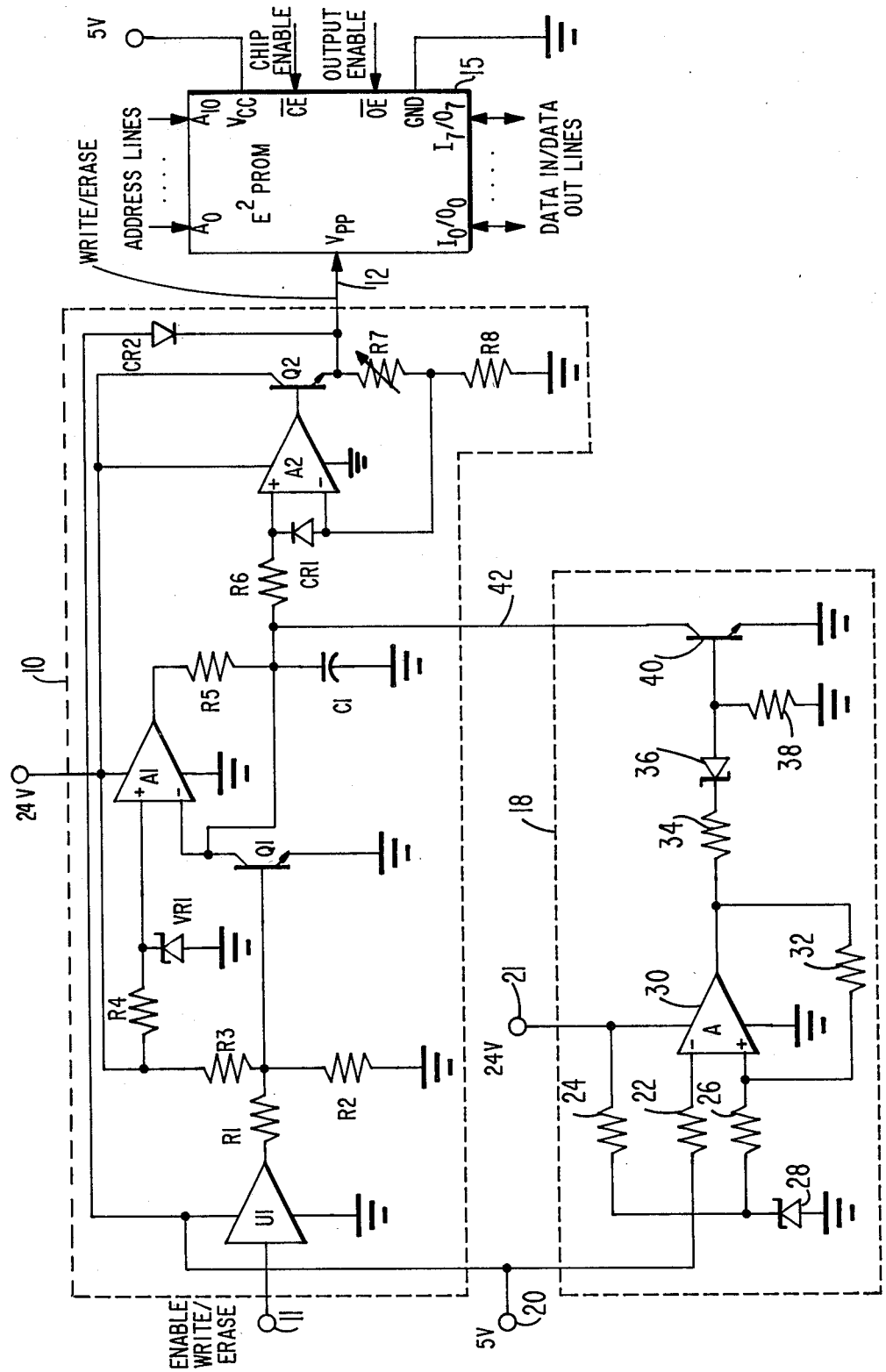

PROTECTION CIRCUIT FOR MEMORY PROGRAMMING SYSTEM

The Government has rights in this invention pursuant to Purchase Order 86XP-DE-61216, subcontracted to the assignee by a contractor of the United States Government.

The present invention relates to memory programming systems and, more particularly, to a protection circuit used to disable the output of a memory write-erase signal generating circuit when the level of a particular voltage source coupled thereto falls below a predetermined threshold value.

The developments during the past several years in the area of non-volatile semiconductor read-only memories (ROM's) have been remarkable. Not only have there been significant increases in the bit capacity of these integrated circuit chips, but the improvements in capability, e.g., speed, power requirements, and operating functions, have been equally astounding. The discussion in the ensuing paragraphs traces the improvements in these ROM operational functions.

The first non-volatile semiconductor storage elements on the market were referred to as ROM's; these devices are random-access semiconductor memories in which the programming of the data pattern is fixed during manufacture. The stored information is read out nondestructively, and no information can subsequently be written into the memory. The manufacturing process of these devices typically includes photomasking a metal layer on the silicon wafer to selectively etch portions of the metal, leaving the desired interconnection pattern corresponding to the data pattern ordered by the customer.

The next development in this area was the introduction of programmable read-only memories (PROM's). Like ROM's, PROM's are unalterable once programmed, but they offer the flexibility of being programmed electrically, by fusing or otherwise removing unwanted internal links. This operation may be performed by a PROM programmer, an electronic device, typically including a keyboard and a tape reader for loading the data pattern into temporary storage, which automatically programs and verifies the PROM in response to a user-initiated console command. A mistake during this operation cannot be corrected.

The first read-only memory with the capability of being altered was the erasable PROM (EPROM). In a typical EPROM, the memory array is visible through a quartz window, and erasure of the entire memory occurs as a result of exposure of the memory array to a source of high intensity ultraviolet light for a matter of minutes. Complete erasure restores all of the bits to their initial (unprogrammed) state in readiness for reprogramming. Like PROM's, EPROM's may be programmed on a PROM programmer.

Electrically erasable PROM's ($E^2$PROM's) have recently been introduced. $E^2$PROM's can be both programmed and erased by the application of electrical signals. The most noteworthy advantage of $E^2$PROM's over the earlier ROM's is the ability to selectively erase a single byte of memory. This advantage provides greatly increased operational flexibility in the area of non-volatile storage. Whereas ROM's and PROM's include a permanently fixed program, and EPROM's can be reprogrammed only after a time-consuming procedure involving several manual operations, $E^2$PROM's offer the flexibility of selective, virtually instantaneous reprogramming within the operating system to meet the changing needs of the system.

This dramatic increase in capability which has developed in the field of non-volatile semiconductor storage is not without its drawbacks. It is standard in the industry that the data, addressing, and control aspects of read-only memories operate from a relatively low dc voltage source used for the logic circuits, typically 5 V (volts), while the write (and erase) operations occur at relatively higher voltages, 24 V for example. Furthermore, the lower voltage logic circuits enable and drive the higher voltage circuit which generates the write-erase signal to alter memory data, making it imperative that the logic voltage source be active whenever the higher voltage write-erase signal is being applied.

Until recently, this requirement that the logic voltage source be active at all times during the higher voltage write-erase signal has not been of great concern to the average user as he has programmed his memories in a PROM programmer which provides the proper power sequence embodied in the manual steps required to accomplish the programming. With the advent of $E^2$PROM's, however, with their attendant ability for in situ program modification, power sequencing control is no longer a purely off-line function, and it is not difficult to envision that, lacking a means for controlling the application of dc voltages to the $E^2$PROM, uncontrolled power turn on and turn off cycles may generate spurious write-erase waveforms. Compounding the problem is the fact that in a typical write-erase signal generating circuit, driven by a logic element supplied by the logic voltage source, a failure of that logic voltage source (and the recovery of it) are almost certain to generate extraneous write-erase pulses which will alter portions of the memory, thereby adversely affecting the operating program and/or data of the system.

In accordance with one embodiment of the present invention a protection circuit is included within an apparatus for generating a high level, controlled rise time, write-erase signal to an electrically erasable programmable read-only memory ($E^2$PROM). The signal generating apparatus is adapted to receive first and second potentials from first and second supplies, respectively, where the second potential is substantially greater than the first. The signal generating apparatus responds to one voltage level at its input to generate the high level signal and responds to a different voltage level to provide no output. The protection circuit includes means for comparing the voltage level of the first supply with a third potential which is less than the first potential. When the voltage level of the first supply is less than the third potential, the comparing means generates a control signal. The protection circuit further includes means responsive to the control signal and coupled to the write-erase signal generating apparatus for inhibiting the generation of the high level signal.

In the drawing:

The sole FIGURE illustrates an $E^2$PROM programming system including a protection circuit for inhibiting write-erase signals to the $E^2$PROM during a specified undervoltage condition.

Users of $E^2$PROM systems are cautioned that the low voltage dc supply, typically 5 V, must be applied simultaneously with or before the application of the higher voltage, typically 21 V, write-erase signal. See, for example, Intel Corporation data sheet for the type 2816 16K Electrically Erasable PROM, April 1981, p. 13, n.9. However, the mere possibility of a failure of the 5 V supply during a write or erase operation is not the impetus for this disclosure; rather it is the certainty that, by using the write-erase signal generating circuit recommended in the aforementioned data sheet, and shown with minor modifications as write-erase signal generating circuit 10 in the FIGURE, a failure of the 5 V supply while the 24 V supply is active will produce a spurious write-erase pulse.

It is well known that as the 5 V dc power applied to a typical $T^2L$ gate decays, there is a point in that decay, at about the 3 V level, that the gate output appears to assume a logic 0 state, sinking current through a seemingly turned-on transistor. This phenomenon continues until the supply voltage drops to approximately 1 V when the gate output switches to a relatively higher impedance, indicative of a logic 1 state.

Referring now to write-erase signal generating circuit 10 of the FIGURE, this is the circuit, with minor modifications, shown in FIG. 12a of the Intel data sheet. The 5 V supply is applied to circuit 10 at U1 and CR2 via terminal 20. Circuit 10 responds to one state of a logic level signal applied at input terminal 11 to provide at signal lead 12 a signal of approximately 21 V and responds to a second state of the input signal to provide a signal on lead 12 of approximately 4.3 V. The signal on lead 12 rises to its high level with an exponential waveform.

The operation of write-erase signal generating circuit 10 is summarized as follows: a high logic level signal at input terminal 11 causes an open circuit at the output of buffer U1 which may be, for example, a $T^2L$ type 7407 open-collector buffer. As a result, resistors R2 and R3 bias transistor Q1 fully on, clamping capacitor C1 to ground potential. The ground potential at the collector of transistor Q1 is also applied through current limiting resistor R6 to the positive (+) input terminal of differential-input amplifier A2. The output of amplifier A2 is driven to its low state by the approximately 0.7 V bias across diode CR1 which is connected between the (−) and (+) terminals of amplifier A2. The bias circuit of diode CR1 includes diode CR2, potentiometer R7, diode CR1, resistor R6 and transistor Q1. The low state of the output of amplifier A2 applied to the base of transistor Q2 holds that transistor off resulting in a voltage on lead 12 of approximately 4.3 V (the 5 V supply voltage less the approximately 0.7 V drop across diode CR2).

When the signal applied at input terminal 11 goes low, the output of buffer U1 is driven low turning off transistor Q1. Capacitor C1 begins to charge from the voltage at the output of differential-input amplifier A1 through resistor R5. As capacitor C1 charges it overcomes the bias across diode CR1 and the output of amplifier A2 is driven toward the 24 V supply. This turns on transistor Q2 and the charging voltage at capacitor C1 appears at the emitter of transistor Q2, resulting in a high level, controlled risetime write-erase signal on lead 12. Capacitor C1 continues to charge until the voltage at the (−) terminal of amplifier A1 equals the voltage applied at its (+) terminal, which is the reverse-breakdown voltage of voltage-regulator diode VR1 which, in the present example, is 20 V. The feedback loop of amplifier A1 attempts to maintain equal voltages at its input terminals, resulting in an approximately 21 V peak signal on lead 12.

The FIGURE shows typical write-erase signal generating circuit 10 coupled to a typical $E^2PROM$ 15, which may be, for example, type 2816 $E^2PROM$ sold by Intel Corp., Santa Clara, California. Coupled also to write-erase signal generating circuit 10 is protection circuit 18 which includes differential-input amplifier 30 having its negative (−) input coupled via resistor 22 to terminal 20, to which is applied the 5 V source of logic level dc voltage. This is the identical source applied to signal generating circuit 10. The positive (+) input terminal of amplifier 30 is coupled via resistor 26 to a voltage dividing network comprising resistor 24 and voltage-regulator diode 28, which may be an avalanche or other type of breakdown diode, in series combination between ground reference and a source of potential which, in the present example, is the 24 V dc voltage applied at terminal 21. Voltage-regulator diode 28 is selected to have a reverse-breakdown voltage such that the (+) terminal of amplifier 30 is maintained during normal operation at a potential somewhat less than the potential at the (−) input terminal. In the present example, the reverse-breakdown voltage of diode 28 is 4.3 V. Amplifier 30 may be, for example, a type LM358 sold by National Semiconductor Corp., Santa Clara, California.

The output of amplifier 30 is coupled through current-limiting resistor 34 and breakdown diode 36, which may be an avalanche diode, to the gate electrode of NPN transistor 40. The output of amplifier 30 is additionally coupled back to the (+) input terminal via positive feedback resistor 32 which reduces the noise at the output of amplifier 30 during switching by providing a Schmitt trigger effect. Breakdown diode 36 is selected to provide a reverse-breakdown voltage which is greater than the low level output of amplifier 30 such that in this condition it electrically disconnects amplifier 30 from the base of transistor 40. In the present example, the reverse-breakdown voltage of diode 36 is 4.3 V. The emitter of transistor 40 is connected to ground and the collector is connected via lead 42 to the charging terminal of capacitor C1 in signal generating circuit 10.

The goal of protection circuit 18 is to disable the output signal provided at lead 12 of signal generating circuit 10 when the low voltage supply, the 5 V dc supply in the present example, falls below a predetermined level. The present invention accomplishes this disabling function by clamping the charging terminal of capacitor C1 at a substantially ground level. With capacitor C1 clamped to ground, the differential inputs of amplifier A2 are biased such that its output is low, maintaining transistor Q2 in a non-conductive state, resulting in a relatively low voltage level at output terminal 12 of approximately 4.3 V.

Protection circuit 18 achieves this goal in the following manner: for a voltage level provided at terminal 20 of 5 V, and a voltage level across voltage-regulator diode 28 of 4.3 V, the output of amplifier 30 is low and is electrically disconnected from transistor 40 by breakdown diode 36. With no current flowing through its base electrode, transistor 40 is maintained in its nonconductive state and its collector electrode, connected via lead 42 to capacitor C1, appears as an open circuit. When the voltage at terminal 20 drops below the voltage across diode 28, amplifier 30 switches, its output signal rises, surpassing the reverse-breakdown voltage of diode 36, and current begins to flow across the base-emitter junction of transistor 40. Transistor 40 is thus switched to its fully conductive state, applying a substantially ground voltage via lead 42 to the charging terminal of capacitor C1, thereby inhibiting further write-erase signals from being applied to E²PROM 15. Restoration of the supply voltage at terminal 20 removes the ground potential from lead 42 once the voltage at terminal 20 exceeds the voltage across voltage-regulator diode 28.

Protection circuit 18 has been built and tested using the following resistor values and semiconductor devices:

| Resistors 22 and 26 | 1 kilohm, |
|---|---|
| Resistors 24 and 34 | 2 kilohm, |
| Resistor 32 | 100 kilohm, |
| Resistor 38 | 10 kilohm, |
| Diodes 28 and 36 | 1N749A, and |
| Transistor 40 | 2N2222A. |

The embodiment shown by example in the FIGURE and described herein was developed specifically to operate with the write-erase signal generating circuit shown in the FIGURE which represents a modification of the circuit described in the Intel data sheet referenced earlier. However, the principles disclosed are applicable to many types of PROM programming systems.

What is claimed is:

1. A protection circuit for an apparatus for generating a high level, controlled risetime, write-erase signal to an electrically erasable programmable read-only memory (E²PROM), said signal generating apparatus including means for coupling first and second power supplies thereto, said first and second supplies providing, when operational, first and second potentials, respectively, where said second potential is substantially greater than said first potential, said signal generating apparatus responsive to one voltage level at the input thereof for generating said high level signal and responsive to a different voltage level for providing no output therefrom, said protection circuit inhibiting the generation of said high level signal whenever the potential provided from said first supply drops below the level of a third potential, less than said first potential, while said second supply is operational, said protection circuit comprising:
    means coupled to said second supply for providing said third potential;
    means coupled between said second supply and reference ground for comparing the voltage level of said first supply with said third potential, said comparing means generating a control signal when the voltage level of said first supply is less than said third potential; and
    means responsive to said control signal and coupled to said signal generating apparatus for inhibiting the generation of said high level signal.

2. The protection circuit according to claim 1 wherein said means for providing said third potential includes a resistor and a voltage-regulator diode coupled in series combination between said second supply and reference ground.

3. The protection circuit according to claim 2 wherein said diode has a reverse-breakdown voltage substantially equal to said third potential.

4. The protection circuit according to claim 1 wherein said comparing means includes a differential-input amplifier.

5. The protection circuit according to claim 1 wherein said inhibiting means includes a transistor having its gate electrode responsive to said control signal.

6. In combination:
    means for generating a high level, controlled risetime, write-erase signal to an electrically erasable programmable read-only memory (E²PROM), said signal generating means including means for coupling first and second power supplies thereto, said first and second supplies providing, when operational, first and second potentials, respectively, where said second potential is substantially greater than said first potential, said signal generating means responsive to one voltage level at the input thereof for generating said high level signal and responsive to a different voltage level for providing no output therefrom;
    means coupled to said second supply for providing a third potential, less than said first potential; and
    a protection circuit for inhibiting the generation of said high level signal whenever the potential provided from said first supply drops below the level of said third potential while said second supply is operational, said protection circuit including means coupled between said second supply and reference ground for comparing the voltage level of said first supply with said third potential, said comparing means generating a control signal when the voltage level of said first supply is less than said third potential, and means responsive to said control signal and coupled to said signal generating means for inhibiting the generation of said high level signal.

7. In combination:
    an electrically erasable programmable read-only memory (E²PROM) having a program voltage terminal which is responsive to a high level, controlled risetime, write-erase signal for enabling changes of data stored by said E²PROM;
    write-erase signal generating means including means for coupling first and second power supplies thereto, said first and second supplies providing, when operational, first and second potentials, respectively, where said second potential is substantially greater than said first potential, said signal generating means responsive to one voltage level at the input thereof for generating said high level signal and responsive to a different voltage level for providing no output therefrom;
    means coupled to said second supply for providing a third potential, less than said first potential; and
    a protection circuit for inhibiting the generation of said write-erase signal whenever the potential provided from said first supply drops below the level of said third potential while said second supply is operational, said protection circuit including means coupled between said second supply and reference ground for comparing the voltage level of said first supply with a third potential, less than said first potential, said comparing means generating a control signal when the voltage level of said first supply is less than said third potential, and means responsive to said control signal and coupled to said signal generating means for inhibiting the generation of said high level signal.

* * * * *